US006858152B2

(12) United States Patent
Koyama et al.

(10) Patent No.: US 6,858,152 B2
(45) Date of Patent: Feb. 22, 2005

(54) METHOD FOR MANUFACTURING LIQUID DISCHARGE HEAD, SUBSTRATE FOR LIQUID DISCHARGE HEAD AND METHOD FOR WORKING SUBSTRATE

(75) Inventors: Shuji Koyama, Kanagawa (JP); Teruo Ozaki, Kanagawa (JP); Shingo Nagata, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 209 days.

(21) Appl. No.: 10/215,015

(22) Filed: Aug. 9, 2002

(65) Prior Publication Data

US 2003/0038108 A1 Feb. 27, 2003

(30) Foreign Application Priority Data

Aug. 10, 2001 (JP) ....................................... 2001/244235

(51) Int. Cl.[7] ........................ G01D 15/00; G11B 5/127; H01L 21/26; H01L 21/42; H01L 21/324

(52) U.S. Cl. ......................................... 216/27; 438/795

(58) Field of Search .......................... 216/27; 29/890.1; 438/719, 753, 795; 347/20, 45, 46, 47, 54, 55, 56, 65, 67, 68, 71

(56) References Cited

U.S. PATENT DOCUMENTS

| | | | | |
|---|---|---|---|---|
| 4,789,425 | A | 12/1988 | Drake et al. | 156/644 |
| 5,347,713 | A | 9/1994 | Shibata et al. | 29/890.1 |
| 5,389,551 | A | 2/1995 | Kamakura et al. | |
| 5,580,468 | A | 12/1996 | Fujikawa et al. | 216/27 |
| 6,113,222 | A | 9/2000 | Ohkuma | 347/63 |
| 6,450,621 | B1 | 9/2002 | Hayakawa | |

FOREIGN PATENT DOCUMENTS

| | | |
|---|---|---|
| EP | 0 597 302 A | 5/1994 |
| EP | 0 750 992 A | 1/1997 |
| EP | 0 841 167 A | 5/1998 |
| JP | 62-264957 | 11/1987 |
| JP | 11-78029 | 3/1999 |
| JP | 2000-153613 | 6/2000 |

*Primary Examiner*—Gregory Mills
*Assistant Examiner*—Roberts Culbert
(74) *Attorney, Agent, or Firm*—Fitzpatrick, Cella, Harper & Scinto

(57) ABSTRACT

An ink supply port is opened in an Si substrate on which an ink discharge energy generating element is formed, by anisotropic etching, from a back surface opposite to a surface on which the ink discharge energy generating element is formed. When the anisotropic etching is effected, OSF (oxidation induced laminate defect) remains on the back surface of the Si substrate with OSF density equal to or greater than $2\times10^4$ parts/$cm^2$ and a length of OSF equal to or greater than 2 $\mu$m.

22 Claims, 5 Drawing Sheets

METHOD FOR MANUFACTURING LIQUID DISCHARGE HEAD, SUBSTRATE FOR LIQUID DISCHARGE HEAD AND METHOD FOR WORKING SUBSTRATE

BACKGROUND OF THE INVENTION

1. Field of the Invention

The present invention relates to a liquid discharge head for effecting recording by forming a flying liquid droplet by discharging liquid and a method for manufacturing such a head, and a method for working a substrate, and more particularly, it relates to a method for forming a liquid supply port for receiving liquid within a liquid discharge head as a through-hole passing through an Si (silicon) substrate constituting the liquid discharge head by means of anisotropic etching for silicon.

2. Related Background Art

A liquid discharge recording apparatus (ink jet recording apparatus) for effecting recording by discharging liquid (ink) and by adhering the liquid to a recording medium has been used in various office equipments such as a printer, a copier, a facsimile and the like. The ink jet recording apparatus generally includes a liquid discharge head (ink jet recording head) and an ink supplying system for supplying the ink to the liquid discharge head. The ink jet recording head generally includes discharge energy generating elements for generating energy for discharging the ink, ink discharge ports through which the ink is discharged, ink flow paths communicated with the respective ink discharge ports, and an ink supply port for receiving ink supplied from an ink supply system.

As one of such ink discharge heads, there is a head of so-called side shooter type in which ink droplets are discharged in a direction perpendicular to a plane of a substrate on which ink discharge energy generating elements are formed. In the ink jet recording head of side shooter type, the ink supply port is generally formed as a through-hole passing through the substrate.

As methods for forming the ink supply port as the through-hole in the substrate, a method for forming the port by mechanical working such as sand blast or ultrasonic grinding and a method for forming the port by chemically etching a substrate are well-known (for example, refer to Japanese Patent Application Laid-open No. 62-264957 and U.S. Pat. No. 4,789,425). In particular, a method for forming the through-hole by anisotropic etching for an Si (silicon) substrate is excellent since the through-hole can be formed with high accuracy. The fact that the ink supply port can be formed with high accuracy leads to the fact that a distance from the ink supply port to the ink discharge energy generating element can be shortened, with the result that ink discharge frequency can be increased remarkably (refer to U.S. Pat. No. 4,789,425 and EP 0609911A2).

In the formation of the through-hole by means of the anisotropic etching, if crystal defects locally exist in the Si substrate, in areas where the crystal defects exist, an etching speed is more increased in comparison with areas where the crystal defects do not exist. Consequently, etching abnormality occurs, with the result that there may be dispersion in a width of the formed through-hole in the conventional ink jet recording head manufacturing methods.

Further, upon effecting of the anisotropic etching of silicon, there may be minute dispersion in a time for starting the etching in dependence upon a condition of an etching start surface and etching conditions (density and temperature of etching liquid and the like). Thus, the etching time is normally set to be longer in order to positively pass the ink supply hole through the substrate (i.e., over etching). In the conventional ink jet recording head manufacturing methods, because there is minute difference in the etching starting time, a side etching amount due to the over etching may be differentiated between parts of the substrate and between substrates, with the result that the width of the through-hole may be deviated minutely from a design value.

As mentioned above, if the width of the through-hole constituting the ink supply port, particularly, the open width of the ink supply port on the surface of the substrate on which the ink discharge energy generating elements are formed is deviated from the design value, the distance between the ink discharge energy generating element and the ink supply port is deviated from a design value, with the result that ink discharging property may be subjected to a bad influence to worsen recording quality of the ink jet recording head. Further, if the open width of the ink supply port on the surface of the substrate is greatly deviated from the design value, a driving circuit for the ink discharge energy generating elements may be subjected to a bad influence. As such, the deviation in open width of the ink supply port on the surface of the substrate is a main factor for reducing through-put of the ink jet recording apparatus.

SUMMARY OF THE INVENTION

The present invention is made in consideration of the above-mentioned conventional drawbacks, and an object of the present invention is to provide a method for manufacturing an ink jet recording head, in which an open width of an ink supply port formed on a surface of a substrate by anisotropic etching of silicon can easily be set to a predetermined width stably with high accuracy. Further, an object of the present invention is to permit manufacture of an ink jet recording head in which through-put of manufacture is enhanced and a distance between the ink supply port and an ink discharge energy generating element is short and accordingly ink discharging frequency can be increased, by setting the open width of the ink supply port on the surface of the substrate to the predetermined width with high accuracy.

To achieve the above objects, a method for manufacturing a liquid discharge head according to the present invention comprises a step for preparing an Si substrate having a first surface as an element forming surface and a second surface as a back surface opposite to the first surface, a step for effecting heat treatment with heating of the Si substrate, a step for forming an $SiO_2$ film on the second surface of the Si substrate, a step for forming an etching start opening portion in the $SiO_2$ film to expose the Si substrate, a step for forming a liquid discharge energy generating element for generating energy for discharging liquid on the first surface of the Si substrate, and a step for forming a liquid supply port passing through the Si substrate and communicated with the first surface from the etching start opening portion by anisotropic etching of Si with using the $SiO_2$ film as a mask, after the heat treatment step and is characterized in that, before the anisotropic etching is effected, density of oxidation induced laminate defect existing in an interface between the Si substrate and the $SiO_2$ film is made to be equal to or greater than $2\times10^4$ parts/cm$^2$.

Further, a length of the oxidation induced laminate defect existing in the interface between the Si substrate and the $SiO_2$ film may be equal to or greater than 2 $\mu$m.

The Inventors found that, upon effecting the anisotropic etching of the Si substrate, by controlling the oxidation induced laminate defect existing on the etching start surface, a speed of side etching can be controlled. That is to say, by increasing the density of the oxidation induced laminate defect and increasing the length of the oxidation induced laminate defect, the speed of the side etching can be increased. And, it was found that, by controlling the oxidation induced laminate defect to increase the speed of the side etching, occurrence of etching abnormality in which a etching speed is locally increased due to crystal defects in the Si substrate can be suppressed.

That is to say, by setting the density of the oxidation induced laminate defect existing in the interface between the Si substrate and the $SiO_2$ film to be equal to or greater than $2\times10^4$ parts/$cm^2$, the etching abnormality can be prevented from occurring when the anisotropic etching is effected. In this case, it is further preferable that the length of the oxidation induced laminate defect is set to be equal to or greater than 2 $\mu$m. Further, the etching speed can be made even between parts of the Si substrate and between plural Si substrates. From the above facts, according to this method, the open width of the liquid supply port on the surface on which the liquid discharge energy generating elements are formed can stably be formed as a desired uniform width.

It is desirable that the formation of the $SiO_2$ film on the back surface of the Si substrate is effected by thermal oxidation during the heat treatment. By effecting the thermal oxidation, it is possible to promote to form the oxidation induced laminate defect on the back surface of the Si substrate.

Although the oxidation induced laminate defect can be formed on the back surface of the Si substrate by effecting the thermal oxidation as mentioned above, when the Si substrate is heated, for example, in a process for forming semiconductor elements on the Si substrate, the oxidation induced laminate defect may be contracted or lost. Accordingly, when the heat treatment including the heating of the Si substrate is effected, it is preferable that the heat treatment is effected by a treatment temperature smaller than 1100° C. By doing so, the oxidation induced laminate defect can be prevented from being lost, and, when the anisotropic etching is effected, sufficient oxidation induced laminate defect can be remained on the back surface of the Si substrate.

Further, the contraction or loss of the oxidation induced laminate defect due to the heating of the Si substrate is progressed as the heat treatment is continued. Thus, before the heat treatment with the high temperature greater than 1100° C. is effected, treatment similar to the heat treatment is performed with lower temperature, so that, by shortening the time of the heat treatment with high temperature, loss of the oxidation induced laminate defect can be suppressed. In this case, it is preferable that a temperature difference (A–B)° C. between a treatment temperature A° C. in the heat treatment with the high temperature and a treatment temperature B° C. in the pre-treatment is equal to or smaller than 200° C.

Further, the heat treatment with the high temperature equal to or greater than 1100° C. may be effected under gas atmosphere including oxygen. By doing so, as the heat treatment is effected, the back surface of the Si substrate is oxidized thermally, with the result that the oxidation induced laminate defect is formed. Thus, the loss due to the heating is compensated by the formation of the oxidation induced laminate defect due to the thermal oxidation, with the result that the total loss of the oxidation induced laminate defect can be suppressed.

As the above-mentioned heat treatment, there is well-drive and the adjustment of the above-mentioned heat treatment can suitably performed with respect to the well-drive.

As the Si substrate used in the method for manufacturing the liquid discharge head according to the present invention, it is preferable that a substrate in which oxygen density is equal to or smaller than $1.3\times10^{18}$ atoms/$cm^3$. In the Si substrate having such low oxygen density, it is known that occurrence of etching abnormality can be suppressed and the etching speed can be stabilized, and, thus, by using such a substrate, dispersion in the open width of the liquid supply port can be suppressed. As the Si substrate having the low oxygen density, an MCZ (magnetic field applied Czochralski method) substrate is preferred.

Further, as the Si substrate used in the present invention, a substrate in which Si crystal face orientation of the surface on which the liquid discharge energy generating elements are formed is <100> or <110> is suitably used. By using such an Si substrate, a liquid supply port with a predetermined configuration having a wall surface inclined at a predetermined angle with respect to the back surface of the substrate can be formed or opened by the anisotropic etching.

The liquid discharge head substrate according to the present invention comprises an Si substrate, liquid discharge energy generating elements formed on the Si substrate and adapted to generate energy for discharging liquid, semiconductor elements, and an opening passing through the Si substrate and formed by anisotropic etching and used for supplying the liquid around the liquid discharge energy generating elements and is characterized in that density of oxidation induced laminate defect existing on a surface opposite to the surface Si substrate on which the liquid discharge energy generating elements are formed is equal to or greater than $2\times10^4$ parts/$cm^2$ and a length of the oxidation induced laminate defect is equal to or greater than 2 $\mu$m.

In the method for manufacturing the liquid discharge head according to the present invention, a method for forming the liquid supply port can generally be applied to a method for manufacturing a substrate, in which a through-hole can be formed with high accuracy. That is to say, the substrate working method according to the present invention comprises a step for effecting heat treatment including heating of the Si substrate, a step for forming an $SiO_2$ film on at least one of surfaces of the Si substrate, a step for forming an etching start opening portion in the $SiO_2$ film to expose the Si substrate, and a step for forming a through-hole passing through the Si substrate after the heat treatment from the etching start opening portion by anisotropic etching of Si with using the $SiO_2$ film as a mask and is characterized in that, before the anisotropic etching is effected, density of oxidation induced laminate defect existing in an interface between the Si substrate and the $SiO_2$ film is made to be equal to or greater than $2\times10^4$ parts/$cm^2$.

DETAILED DESCRIPTION OF THE PREFERRED EMBODIMENTS

Figure 2:
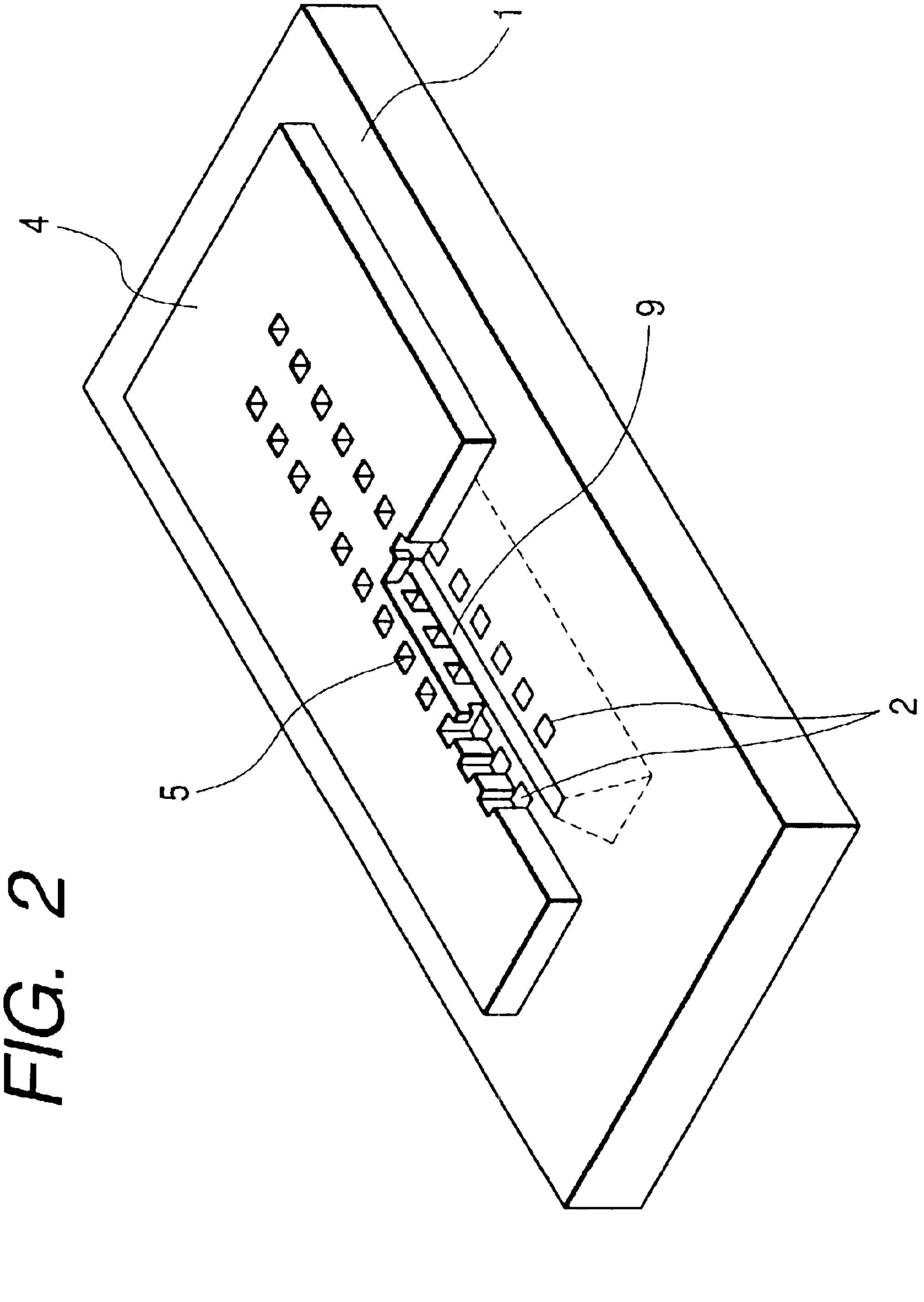
FIG. 2 is a schematic perspective view, partial in section, showing the ink jet recording head according to the embodiment of the present invention.

The present invention will now be fully explained in connection with embodiments thereof with reference to the accompanying drawings. FIGS. 2 to 4 schematically show an ink jet recording head manufactured in an embodiment of the present invention. FIG. 2 is a perspective view, partial in section, showing the ink jet recording apparatus, FIG. 3A is a plan view looked at from a discharge port side of the ink jet recording head, FIG. 3B is a sectional view taken along the line 3B—3B in FIG. 3A, and FIG. 4 is a plan view looked at from an ink supply port side of the ink jet recording head.

The ink jet recording head (liquid discharge head) has an Si (silicon) substrate 1 on which ink discharge energy generating elements (liquid discharge energy generating elements) 2 are formed side by side at a predetermined pitch. As will be described later, an ink supply port (liquid supply port) 9 formed in the Si substrate 1 by anisotropic etching of Si with using an $SiO_2$ film 7 as a mask is disposed between two arrays of the ink discharge energy generating element 2. On the Si substrate 1, ink discharge ports (liquid discharge ports) 5 opened to spaces above the respective ink discharge energy generating elements 2 and ink flow paths (liquid flow paths) communicated from the ink supply port 9 to the respective ink discharge ports 5 are formed by an orifice plate member 4.

Figure 3A:
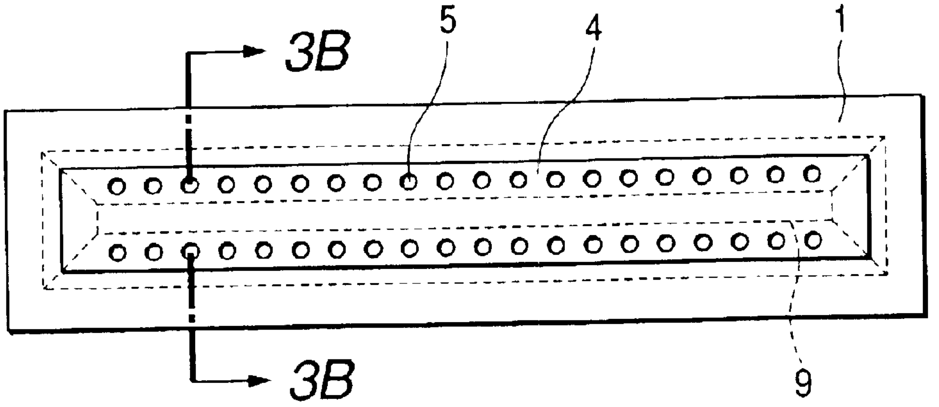
FIG. 3A is a plan view looked at from a discharge port side of the ink jet recording head of FIG. 2.
Figure 3B:
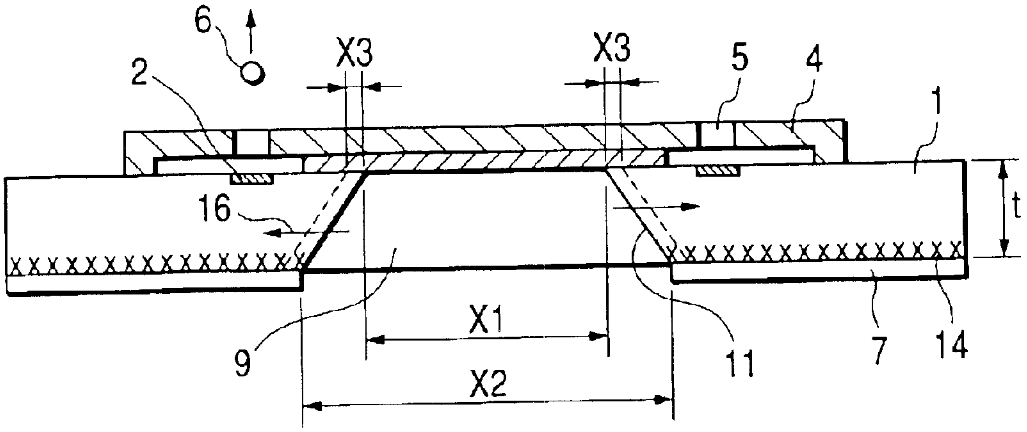
FIG. 3B is a sectional view taken along the line 3B—3B in FIG. 3A.
Figure 4:
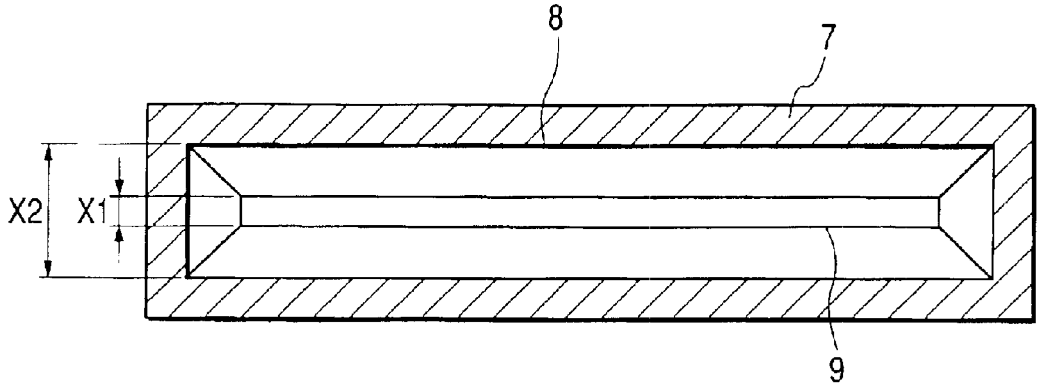
FIG. 4 is a plan view looked at from an ink supply port side of the ink jet recording head of FIG. 2.

Incidentally, in FIGS. 3A and 3B, while a condition that the ink discharge energy generating elements 2 and the ink discharge ports 5 are arranged symmetrically with the interposition of the ink supply port 9 was illustrated for clarify's sake, normally, two arrays of ink discharge energy generating elements 2 and ink discharge ports 5 with the interposition of the ink supply port 9 are staggered by half a pitch.

The ink jet recording head is installed so that the surface in which the ink supply port 9 is formed is opposed to a recording surface of a recording medium. In the ink jet recording head, recording is effected by discharging an ink droplet 6 from the ink discharge port 5 to be adhered to the recording medium by applying pressure generated by the ink discharge energy generating element 2 to ink (liquid) loaded within the ink flow path through the ink supply port 9. In the ink jet recording head according to the illustrated embodiment, the ink droplet 6 is discharged toward a direction substantially perpendicular to the surface in which the ink discharge energy generating element 2 are formed, as shown by the arrow in FIG. 3B.

Now, a substrate portion of the ink jet recording head shown in FIGS. 2 to 4 will be explained with reference to FIG. 7.

In the recording head according to the illustrated embodiment, electrical/thermal converting elements as the ink discharge energy generating elements, elements (referred to as "switch elements" hereinafter) for switching the electrical/thermal converting elements and a circuit for driving the switch elements are mounted on the same substrate.

Figure 7:
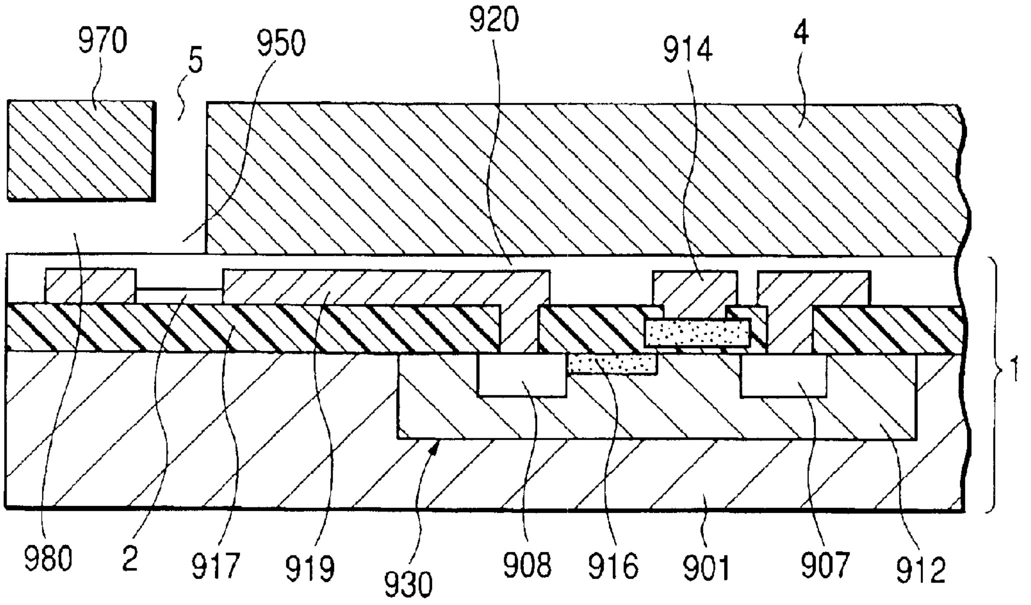
FIG. 7 is a schematic sectional view showing a part of the recording head according to the embodiment.

FIG. 7 is a schematic sectional view showing a part of the recording head according to the illustrated embodiment. The reference numeral 901 denotes a semiconductor substrate comprised of mono-crystal silicon. The reference numeral 912 denotes a well area of p type; 908 denotes a drain area of n type having high impurity density; 916 denotes an electrical field relaxation drain area of n type having low impurity density; 907 denotes a source area n type having high impurity density; and 914 denotes a gate electrode, which elements constitute a switch element 930 using an MIS type electrical field effect transistor. The reference numeral 917 denotes a regenerator layer and a silicon oxide layer as an insulation layer; 918 denotes a tantalum nitride film as a heat resistance layer; 919 denotes an aluminium alloy film as wiring; and 920 denotes a silicon nitride film as a protective layer. In this way, a substrate 940 of the recording head is formed. Here, the reference numeral 950 denotes a heat generating portion, and the ink is discharged from the port 5. Further, a top plate 970 cooperates with the substrate 940 to define a liquid path 980.

The ink jet recording head can be mounted to an apparatus such as a printer, a copier, a facsimile having a communication system and a word processor having a printer portion and an industrial recording apparatus functionally combined with various processing devices. By using the ink jet recording head, the recording can be effected on various recording media such as a paper, thread, fiber, cloth, leather, metal, plastic, glass, wood, ceramic and the like. Incidentally, in the present invention, the word "recording" also means that not only a meaningful image such as a character or a figure is applied onto the recording medium but also a meaningless image such as a pattern is applied onto the recording medium.

Next, the ink jet recording head manufacturing method shown in FIGS. 2 to 4 will be explained with reference to FIGS. 1A to 1F. FIGS. 1A to 1F are schematic sectional views showing manufacturing steps for the ink jet recording head. Incidentally, here, an example of a method for manufacturing an ink jet recording head of so-called bubble jet recording type in which heat generating resistance elements are used as the ink discharge energy generating elements will be explained.

Figure 1A:
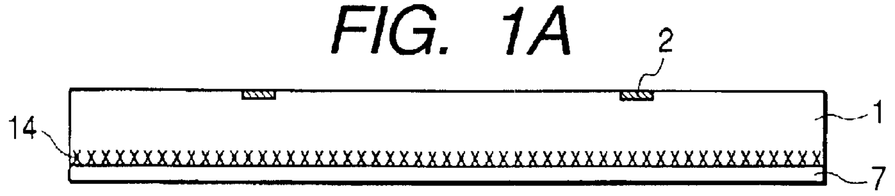
FIGS. 1A, 1B, 1C, 1D, 1E and 1F are schematic sectional views showing steps of a method for manufacturing an ink jet recording head according to an embodiment of the present invention.

In the illustrated embodiment, a substrate in which Si crystal face orientation of the surface on which the ink discharge energy generating elements 2 are formed is <100> is used as the Si substrate 1. Further, a substrate in which the Si crystal face orientation is <110> may be used. First of all, as shown in FIG. 1A, the ink discharge energy generating elements 2 and a drive circuit (not shown) including semiconductor elements for driving the ink discharge energy generating elements are formed on the Si substrate 1 by a conventional semiconductor manufacturing technique. Further, after the drive circuit has been formed, electrical pick-up electrodes (not shown) for connecting the ink discharge energy generating elements 2 to a control equipment disposed out of the ink jet recording head are formed.

In this case, an oxidation film, i.e., an $SiO_2$ film 7 is formed on a surface (i.e., back surface) opposite to the surface of the Si substrate 1 on which the ink discharge energy generating elements 2 were formed. The $SiO_2$ film 7 is a thermal oxidation film formed to be used for element separation when the semiconductor elements are formed on the Si substrate 1. The $SiO_2$ film 7 is remained on the back surface of the Si substrate 1 in order that is it used as an etching mask when the ink supply port 9 is formed or opened in the latter manufacturing step. It is desirable that a thickness of the $SiO_2$ film 7 is equal to or greater than 0.7 μm.

Figure 1B:
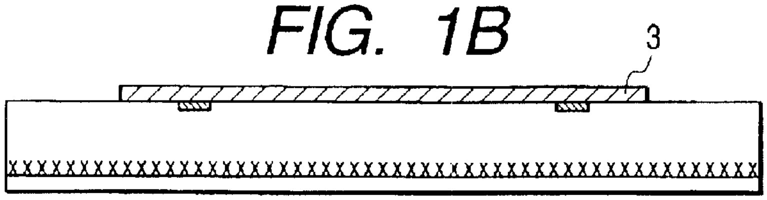

Then, as shown in FIG. 1B, a shaping member 3 is formed on the surface of the Si substrate 1 on which the ink discharge energy generating elements 2 were formed. The shaping member 3 is formed in order that it is dissolved in the latter manufacturing step to form the ink flow paths in the dissolved area, and the shaping member has a height and a plane pattern corresponding to those of the ink flow paths in order to obtain desired height and plane pattern of the ink flow paths. Formation of such a shaping member 3 can be effected in the following manner, for example.

First of all, for example, positive type photo-resist ODUR1010 (trade name; manufactured by TOKYO OUKA KOGYO Co., Ltd.) is used as material of the shaping member 3, and such positive type photo-resist is coated on the Si substrate to have a predetermined thickness by dry film laminating or spin coating. Then, the patterning is effected by using a photolithography technique for performing exposure and development utilizing an ultraviolet ray or UV light. As a result, the shaping member 3 having predetermined thickness and plane pattern can be obtained.

Figure 1C:
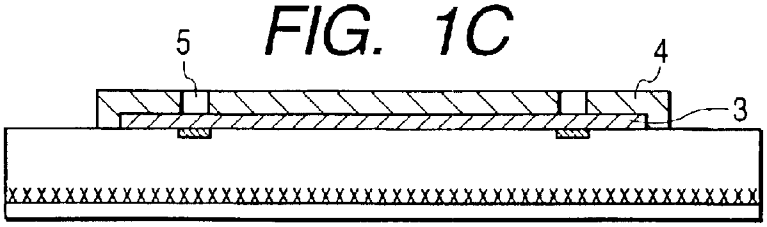

Then, as shown in FIG. 1C, an orifice plate material 4 is coated on the Si substrate 1 to cover the shaping member 3 formed in the previous step by spin coating and the like, and such material is patterned to form a predetermined configuration by the photolithography technique. And, the ink discharge ports 5 are formed or opened at predetermined positions above the ink discharge energy generating elements 2 by the photolithography technique. Further, a water repelling layer (not shown) is formed on the surface of the orifice plate material 4 to which the ink discharge ports 5 are opened by dry film laminating or the like.

As material of the orifice plate material 4, photo-sensitive epoxy resin, photosensitive acrylic resin can be used. Since the orifice plate material 4 is used for constituting the ink flow paths and is always contacted with the ink when the ink jet recording head is being used, as the material thereof, cationic polymerized compound obtained by photo-reaction is particularly suitable. Further, since endurance of the orifice plate material 4 greatly relies upon the kind and property of ink used, appropriate compound other than the above-mentioned compound may be used in dependence upon the ink used.

Figure 1D:
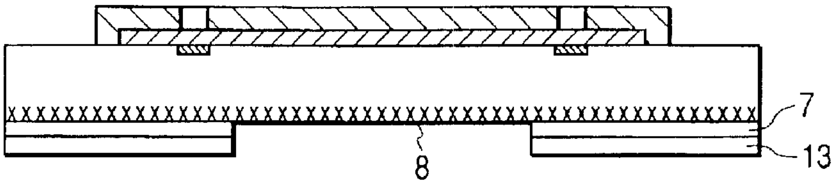

Then, as shown in FIG. 1D, an $SiO_2$ film patterning mask 13 as mask agent having alkali resistance is formed on the $SiO_2$ film formed on the back surface of the Si substrate 1. The $SiO_2$ film patterning mask 13 is formed in the following manner for example.

First of all, the mask agent constituting the $SiO_2$ film patterning mask 13 is coated on the entire back surface of the Si substrate by spin coating or the like and then is thermally hardened. Further, positive type resist is coated thereon by spin coating or the like and then is dried. Then, the positive type resist is patterned by using the photolithography technique, and exposed parts of the mask agent constituting the $SiO_2$ film patterning mask 13 are removed by dry etching or the like with using the positive type resist as a mask. Lastly, the positive type resist is peeled to obtain the $SiO_2$ film patterning mask 13 having a predetermined pattern.

Then, the $SiO_2$ film 7 is patterned by wet etching or the like with using the $SiO_2$ film patterning mask 13 as a mask, thereby forming an etching start opening portion 8 for exposing the back surface of the Si substrate 1.

Figure 1E:
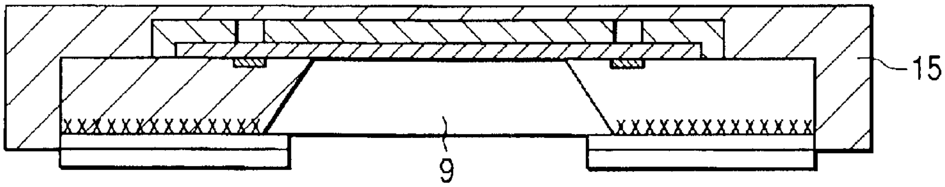

Then, as shown in FIG. 1E, the ink supply port 9 as a through-hole passing through the Si substrate 1 is formed or opened by anisotropic etching with using the $SiO_2$ film 7 as a mask. In this case, a protective material 15 comprised of resin is previously coated and formed by spin coating or the like to cover the surface on which the functional elements of the ink jet recording head are formed and side surfaces of the Si substrate 1 so that the etching liquid does not contact with these surfaces. As material of the protective material 15, material having resistance sufficient to endure against strong alkaline solution used in the anisotropic etching is used. By also covering the orifice plate material 4 by such protective material 15, deterioration of the above-mentioned water repelling layer can be prevented.

As the etching liquid used in the anisotropic etching, for example, strong alkaline solution such as TMAH (tetramethyl ammonium hydroxide) solution is used. And, for example, the through-hole is formed or opened by applying solution including TMAH of 22 weight % and having a temperature of 80° C. to the Si substrate 1 through the etching start opening portion 8 for a predetermined time (ten and several hours).

Figure 1F:
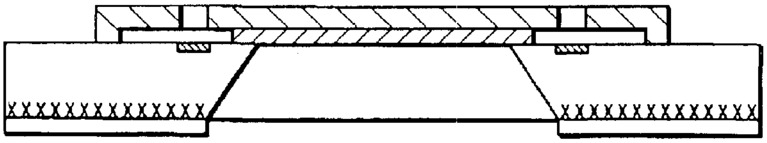

Lastly, as shown in FIG. 1F, the $SiO_2$ film film patterning mask 13 and the protective material 15 are removed. Further, the shaping member 3 is dissolved to remove it from the ink discharge ports 5 and the ink supply port 7, and then the drying is effected. The dissolving of the shaping member 3 can be carried out by effecting development after the entire exposure is performed by deep UV light, and, if necessary, by using ultrasonic dipping during the development, the shaping member 3 can be removed substantially completely.

In this way, the main manufacturing steps for the ink jet recording head are completed. If necessary, to a chip formed in this way, connecting portions for driving the ink discharge energy generating elements 2 and a chip tank for supplying the ink can be attached. Incidentally, in FIGS. 1A to 1F, while the single ink jet recording head was illustrated, it should be noted that a so-called plural-heads simultaneous manufacturing method used in general semiconductor manufacturing techniques can be used. In the plural-heads simultaneous manufacturing method, plural components (here, ink jet recording heads) having the same arrangement are formed side by side on a single substrate. Then, the plural components arranged on the substrate are separated from each other by dicing or the like to obtain respective chips.

In the ink jet recording head manufacturing method as mentioned above, in the opening or forming of the ink supply port 9, by effecting the anisotropic etching from the back surface (<100> face) of the Si substrate 1, as shown in FIG. 3B, ink supply port wall surfaces 11 (face orientation <111>) having an angle of 54.7° with respect to the back surface are formed. Accordingly, when the anisotropic etching is performed, by selecting an open width X2 of the etching start opening portion 8 opened in the $SiO_2$ film on the back surface of the Si substrate 1 to a predetermined width, an open width X1 of the ink supply port 9 on the surface of the substrate on which the ink discharge energy generating elements 2 are formed can be set to a predetermined width. That is to say, when it is assumed that a thickness of the Si substrate is t, the following general equation is established:

$$X1=X2-2t/\tan 54.7°$$

Further, in the anisotropic etching, actually, over etching in which etching is effected for a longer time period longer than a time period during when the through-hole is actually formed in the Si substrate 1 is performed. When such over etching is performed, after the through-hole was formed, as shown in FIG. 3B, side etching is generated in directions shown by the arrows 16 laterally from the etching start opening portion 8. Accordingly, the opening of the ink supply port 9 at the front surface side is widened by the side etching by a predetermined amount (X3) along each side, with the result that the actual open width becomes (X1+2X3).

From the above, if the anisotropic etching can be effected well by forming the open width X2 of the etching start opening portion 8 with high accuracy, the open width of the ink supply port 9 on the front surface of the Si substrate 1 can correctly be regulated with high accuracy. Accordingly, the distance from the opening of the ink supply port 9 to the ink discharge energy generating elements 2 can correctly be regulated with high accuracy.

Figure 5:
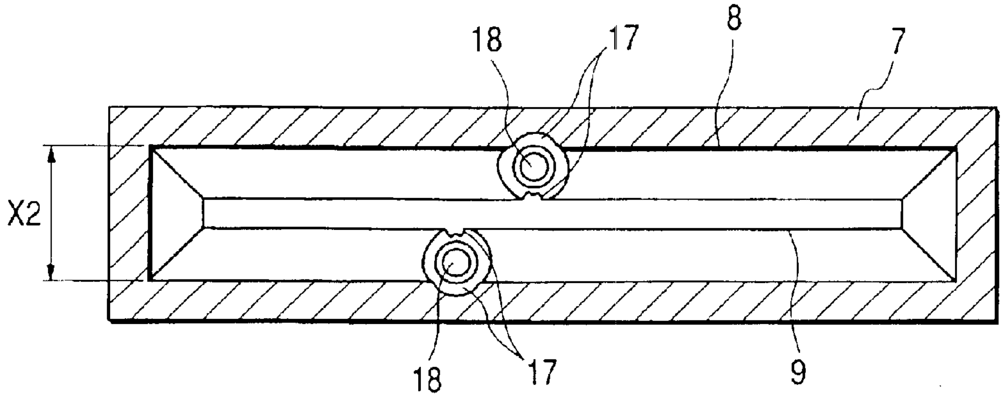
FIG. 5 is a plan view looked at from the ink supply port side of the ink jet recording head, showing a condition of the ink supply port when etching abnormality is generated.
Figure 6:
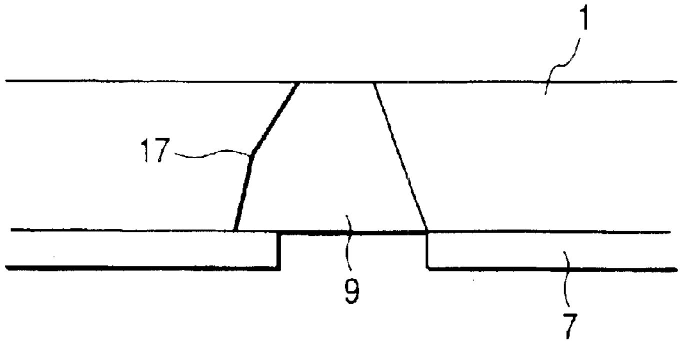
FIG. 6 is a sectional view of the ink supply port, showing a condition of the ink supply port when etching abnormality is generated.

However, crystal defect may occur in the Si substrate due to various factors such as influence of a semiconductor dispersion step, for example. If there is the crystal defect in the area of the Si substrate in which the ink supply port 9 is to be formed, when the anisotropic etching is effected, the etching speed in the crystal defect portion becomes greater than the etching speed in the other portions to generate etching abnormality, with the result that, in the conventional manufacturing methods, the open width of the ink supply port 9 on the front surface of the Si substrate 1 may partially be deviated from a design value greatly. FIGS. 5 and 6 schematically show a condition of the ink supply port 9 when such etching abnormality is generated. FIG. 5 is a plan view looked at from the back surface side of the Si substrate 1 and FIG. 6 is a sectional view. As shown in FIGS. 5 and 6, in areas where there are the crystal defects 18, etching is advanced locally in comparison with the other areas, with the result that, as shown as etching abnormalities 17, recesses are formed in such areas, thereby widening the open width of the ink supply port 9 partially.

Further, in the conventional manufacturing methods, there may be minute dispersion in time for starting the etching due to the condition of the etching start surface and/or the etching conditions (density/temperature of the etching liquid). Consequently, the side etching amount X3 may partially be changed in the Si substrate 1 or may be changed between plural Si substrates, with the result that the open width of the ink supply port 9 may be changed.

If the open width of the ink supply port 9 on the front surface of the Si substrate 1 is deviated from the design value to be widened in this way, the distance between the ink discharge energy generating elements 2 and the ink supply port 9 will be deviated from the design value to be shortened. Consequently, when the ink is discharged, the pressure generated by the ink discharge energy generating element 2 is apt to be escaped toward the ink supply port 9, with the result that the ink discharging property is subjected to a bad influence, thereby deteriorating the recording quality of the ink jet recording head. Further, if the open width of the ink supply port 9 at the front surface side is deviated from the design value further greatly, the drive circuit for the ink discharge energy generating elements 2 is subjected to a bad influence, thereby worsening electrical reliability of the ink jet recording head. As such, the deviation of the open width of the ink supply port 9 at the front surface side becomes a great factor for reducing the through-put of the ink jet recording apparatus.

As a method for enhancing accuracy for forming the open width of the ink supply port 9 at the front surface side of the substrate, Japanese Patent Application Laid-open No. 11-078029 discloses a method using an MCZ substrate in which oxygen density in the substrate is low. As disclosed in this document, a substrate in which the oxygen density in the substrate is equal to or smaller than $1.4\times10^{18}$ (atoms/$cm^3$) is used, it was ascertained that the above-mentioned etching abnormality can be reduced greatly. Further, when a substrate in which the oxygen density in the substrate is equal to or smaller than $1.3\times10^{18}$ (atoms/$cm^3$) is used, it was ascertained that the side etching amount caused by the over etching can be stabilized. By stabilizing the side etching amount, the dispersion in the open width due to the difference in side etching amount as mentioned above can be suppressed to the small extent.

However, the Inventors found that, even if the Si substrate in which the oxygen density is low is used, when the treatment including the heating of the Si substrate is carried out, the etching abnormality may be generated again in dependence upon the treatment condition. As the treatment including the heating of the Si substrate, concretely, there is well-drive when semiconductor elements such as transistors are formed on the Si substrate, for example. Such treatment is indispensable when the functional elements of the ink jet recording head are formed.

The Inventors investigated to prevent the deviation in the open width of the ink supply port 9 at the front surface side of the substrate. As a result, the following conclusion could be obtained.

First of all, it was found that a layer having great etching rate may exist between the back surface of the Si substrate 1 and the $SiO_2$ film 7 and, in this case, the etching speed of the anisotropic etching depends upon a property of such a layer. And, it was also found that, when the etching speed depending upon the property of the layer having the great etching rate is relatively fast, occurrence of the etching abnormality can be suppressed. Further, it was found that, when the substrate having the oxygen density equal to or smaller than $1.3\times10^{18}$ (atoms/$cm^3$) is subjected to certain heat treatment (equal to or greater than 1100° C.), the layer having the great etching rate is lost and the etching speed is decreased, and, in this case, the etching abnormality occurs.

As a result that surface defect of the layer having the great etching rate was checked, OSF (oxygen induced laminate defect) was observed with density of about $10^5$/$cm^2$ with respect to the substrate not subjected to the heat treatment. On the other hand, regarding the substrate which was subjected to the heat treatment to lose the layer having the great etching rate, it was found that the OSF is lost. That is to say, it is considered that the reason why the etching rate is great is due to the presence of the OSF.

Thus, the Inventors thought that, by providing OSF 14 in an interface between the back surface of the Si substrate 1 and the $SiO_2$ film 7 and by properly controlling the OSF, as schematically shown in FIGS. 1A to 1F and FIG. 3B, the open width of the ink supply port 9 at the front surface side can be made to a predetermined uniform width. Hereinbelow, embodiments showing results obtained by investigation regarding concrete methods for controlling the OSF will be described.

(First Embodiment)

By repeating experiments, the Inventors found that density and length of the OSF on the back surface of the Si substrate 1 have co-relation with etching rate of the ink supply port wall surface 11 having Si crystal orientation of <111>. More concretely, it was found that, when the density of the OSF on the back surface of the Si substrate 1 is small and the length of the OSF is short, the etching rate is small, and, when the density of the OSF is small and the length of the OSF is short in this way, the influence of the crystal defect within the Si substrate 1 affecting upon the formation of the ink supply port wall surface 11 becomes great.

Thus, the Inventors thought that, by increasing the density of the OSF on the back surface of the Si substrate 1 and by increasing the length of the OSF to increase the etching rate, the influence of the crystal defect can be absorbed by the fact side etching thereby to reduce the influence of the crystal defect.

Although the side etching amount is increased by doing so, the side etching amount can be made to the predetermined uniform amount by properly regulating the density and length of the OSF on the back surface of the Si substrate 1. Accordingly, it is considered that the dispersion in the open width of the ink supply port 9 at the front surface side due to the above-mentioned dispersion on the side etching amount can be suppressed.

Here, an example that the ink supply port 9 is actually opened by means of the anisotropic etching by changing the density of the OSF on the back surface of the Si substrate 1 is shown. Although the OSF is generated by various factors, one of such factors is the formation of the $SiO_2$ film effected by the thermal oxidation of the Si substrate 1. Thus, the density and length of the OSF can be changed by changing the $SiO_2$ film forming condition, and, in the illustrated embodiment, the Si substrate 1 was formed by changing the density and length of the OSF in this way. The following Table 1 shows a result of evaluation regarding the dispersion in the open width of the ink supply port 9 at the front surface side when the ink supply ports 9 were formed or opened in the respective Si substrates 1 obtained in this way by means of the anisotropic etching. In this case, the dispersion in the open width of the ink supply port 9 at the front surface side was evaluated on the basis of a difference between a maximum value and a minimum value of the open width of the formed ink supply port 9 at the front surface side, and, if the difference is greater than 40 μm, the evaluation was "x", and, if the difference is between 40 and 30 μm, the evaluation was "Δ", and, if the difference is smaller than 30 μm, the evaluation was "○".

TABLE 1

| OSF density ($\times 10^4$ parts/$cm^2$) | OSF length (μm) | Dispersion in Ink supply port |
|---|---|---|
| 0 | 0 | x (≧40 μm) |
| 1 | 2 | x |
| 2 | 1 | x |
| 2 | 2 | Δ (30–40 μm) |
| 2 | 10 | Δ |
| 3 | 8 | Δ |
| 4 | 12 | ○ (≦30 μm) |
| 10 | 4 | ○ |
| 10 | 8 | ○ |
| 50 | 8 | ○ |

As apparent from the Table 1, when the density of the OSF is equal to or greater than $2\times10^4$ parts/$cm^2$ and the length of the OSF is equal to or greater than 2 μm, the dispersion in the open width of the ink supply port 9 at the front surface side is suppressed to be equal to or smaller than 30 μm.

As mentioned above, according to this embodiment, it was found that, when the ink supply port 9 is formed, by selecting the density of the OSF on the back surface of the Si substrate 1 to be equal to or greater than $2\times10^4$ parts/$cm^2$ and the length of the OSF to be greater than 2 μm, the dispersion in the open width of the formed ink supply port 9 at the front surface side can be suppressed to the small extent.

By suppressing the dispersion in the open width of the formed ink supply port 9 at the front surface side to the small extent, the distance between the ink supply port 9 and the ink discharge energy generating elements 2 can be regulated with high accuracy, with the result that an ink jet recording head in which reliable recording is effected with high quality can be manufactured. Further, the part of the opening of the ink supply port 9 at the front surface side can be prevented from reaching the vicinity of the ink discharge energy generating element 2 to affect a bad influence upon the drive circuit. Further, as a result, the distance between the ink supply port 9 and the ink discharge energy generating elements 2 can be set to be shorter, thereby manufacturing an ink jet recording head having high ink discharging frequency with high through-put.

(Second Embodiment)

As a result of investigation regarding the method for controlling the OSF on the back surface of the Si substrate 1, the Inventors found that the density and length of the OSF are varied with the formation of the semiconductor elements on the Si substrate 1. Such discovery will be explained hereinbelow.

The semiconductor elements are normally formed in areas which are relatively shallow (several μm at the most) from the surface of the Si substrate 1. What is important to enhance through-put, performance and reliability of the semiconductor elements, Si crystallization is made complete in these areas near the surface of the substrate. As one of methods for forming a non-defect layer in the vicinity of the surface of the substrate and making the crystallization therein complete, there is gettering. The gettering is a method in which gettering site acting to catch and fix contaminant such as metal detrimental to formation of the semiconductor element is intentionally provided. The gettering can be divided into IG (internal gettering) and EG (external gettering). As one of EG treatments, there is BD (backside damage). This is a method in which a mechanical damage layer is formed on the back surface of the substrate and this layer is utilized as the gettering site.

The mechanical damage is one of factors for affecting an influence upon nucleation of OSF. When the BD is effected, the OSF having density greater than some extent is existing on the back surface of the Si substrate. The density of the OSF on the back surface of the Si substrate in this condition is density sufficient to suppress occurrence of poor etching to make the open width of the through-hole to the predetermined uniform width even if there is crystal defect in the Si substrate when the anisotropic etching is effected, as mentioned in connection with the first embodiment.

Now, explaining growth and contraction of the OSF, interstitial Si and hole are greatly associated with such growth and contraction. When the $SiO_2$ film is formed on the Si substrate by thermal oxidation, supersaturated interstitial Si is generated in the interface between the $SiO_2$ film and the Si substrate, and the interstitial Si is diffused in an area around the OSF, and a part thereof is picked up to grow the OSF. On the other hand, the interstitial Si decreases hole density below thermal equilibrium in an area near the interface between the $SiO_2$ film and the Si substrate. Consequently, the hole is diffused from the bulk portion of the Si substrate to the interface between the $SiO_2$ film and the Si substrate, with the result that the OSF is contracted or lost. In general, the OSF may be lost by high temperature heat treatment. The reason is that the hole density is increased by the high temperature heat treatment and is combined with the interstitial Si.

Thus, even when the OSF having constant density is formed on the back surface of the substrate by the EG as mentioned above, the OSF may be lost during the high temperature heat treatment in the later semiconductor element forming step. The second embodiment tries to prevent the OSF from being lost by such high temperature heat treatment in the course of the manufacture of the ink jet recording head.

In the course of the manufacture of the ink jet recording head, as a step for effecting the high temperature heat treatment with respect to the Si substrate, there is well-drive when the semiconductor element is formed. As well-drives, concretely, there are N well-drive in case of single well (only N well) type and N well-drive and P well-drive in case of twin well (N well, P well) type. Regarding the well, a relatively deep N or P type conductive area is required, and the depth of the well is greatly influenced by the temperature and time of the heat treatment in the well-drive. Thus, even when the temperature of the heat treatment in the well-drive is changed (more concretely, even when the temperature of the heat treatment is decreased), by adjusting the treatment time (more concretely, by lengthening the treatment time), the same depth of the well (in other words, the same electrical property) can be obtained. Accordingly, the temperature of the heat treatment in the well-drive can be changed within a certain range without deteriorating the electrical property of the semiconductor element to be formed.

Thus, the semiconductor elements were formed on the Si substrate by changing the heat treatment temperature in the well-drive (which is heat treatment at a maximum temperature among the semiconductor manufacturing steps for forming the semiconductor elements on the Si substrate) to 1100° C., 1150° C. and 1200° C. In this case, in each case, the treatment time was adjusted to obtain the same depth of the well. An MCZ substrate of 6 inches in which Si crystal orientation of the surface of the substrate subjected to EG treatment is <100> was used as the Si substrate. Accordingly, at least before the heat treatment, the OSF having density greater than a certain value exists on the back surface of the Si substrate.

The ink supply port was opened in each Si substrate (on which the semiconductor elements were formed) by anisotropic etching. Presence/absence of the OSF was checked by effecting second etching with respect to the Si substrates which were subjected to the anisotropic etching. Further, the side etching speed was evaluated on the basis of the open width of the ink supply port 9 and the open width of the $SiO_2$ film 7 and the etching treatment time as "side etching time=(open width of Si substrate−open width of $SiO_2$ film)/treatment time". Regarding the side etching speed, a maximum value and a minimum value of each substrate were sought. A result is shown in the following Table 2, together with similar evaluation regarding a comparative example in which the ink supply port was opened in the Si substrate on which only the $SiO_2$ film was formed. Incidentally, since the there was substantially no dispersion in the open width of the $SiO_2$ film, the maximum value and the minimum value of the side etching speed correspond to speeds regarding maximum and minimum portions of the open width of the Si substrate, respectively. Further, each of values of the side etching speed shown in the Table 2 is an average value between plural substrates.

TABLE 2

| | Drive temperature (max. heat treatment temp.) (° C.) | Presence/absence of OSF on back surface Of substrate | Side etching Speed (μm/hr) |
|---|---|---|---|
| embodiments | 1100 | ○ | 11.7–12.2 |
| | 1150 | x | 3.6–6.0 |
| | 1200 | x | 3.8–7.7 |
| Comparative Example | — | ○ | 12.3–12.6 |

From the results shown in the Table 2, it can be seen that, when high temperature treatment exceeding 1100° C. is effected, although the OSF is almost lost, by limiting the treatment temperature of the heat treatment at the maximum temperature in the semiconductor manufacturing process to be equal to or smaller than 1100° C., the OSF can be prevented from being lost to be remained. If the OSF is lost, the side etching speeds are greatly differentiated between the area where the crystal defect exist and the area where the crystal defect does not exist, thereby creating great deviation of 3 to 8 μm/hr. To the contrary, when the OSF is reserved adequately and when the heat treatment temperature at the maximum temperature is limited to or below 1100° C., the side etching speed is stabilized at about 12 μm/hr throughout. That is to say, it is considered that, when the OSF is reserved adequately, the side etching speed is increased, with the result that the dispersion in etching speed due to the presence/absence of the crystal defect can be absorbed.

Then, when a plurality of articles in which the ink supply port was opened, by the anisotropic etching, in each of the Si substrates on which the semiconductor elements were formed under the above-mentioned various treatment conditions were manufactured, regarding each treatment condition, a rate that the open width of the ink supply port was deviated from a predetermined range was evaluated as poor etching rate. Results are shown in the following Table 3.

TABLE 3

| | Drive temperature (max. heat treatment temp.) (° C.) | Poor etching Generating rate |
|---|---|---|
| Embodiments | 1100 | 1 |
| | 1150 | 22 |
| | 1200 | 25 |

As apparent from the results shown in the Table 3, it can be seen that, when the treatment temperature of the heat treatment at the maximum temperature in the semiconductor manufacturing process is limited to be equal to or smaller than 1100° C., the generating rate of the poor etching is reduced greatly.

As mentioned above, according to the second embodiment, it was found that, regarding the semiconductor manufacturing process for forming the semiconductor elements on the Si substrate, by limiting the heat treatment temperature at the maximum temperature to be equal to or smaller than 1100° C., the open width of the ink supply port opened by the anisotropic etching can stably be made to the predetermined uniform width.

(Third Embodiment)

As explained in connection with the second embodiment, when the Si substrate is subjected to the heat treatment at high temperature, the OSF may be contracted or lost, since the hole density is increased by the high temperature heat treatment to be combined with the interstitial Si. However, observing in detail, the OSF grows until the flow of the interstitial Si becomes smaller than the flow of the hole, and the contraction starts as soon as the flow of the interstitial Si becomes smaller than the flow of the hole. The greater the temperature, the shorter the time for starting the contraction.

As mentioned above, in the manufacturing steps for the ink jet recording head, in the well-drive in which the Si substrate is subjected to the high temperature heat treatment, the deep well can be obtained for a short time by the high temperature heat treatment. However, in the high temperature, heat treatment, the OSF will be lost for a short time. On the other hand, when the heat treatment temperature is low, although the OSF can be prevented from being lost, the long term heat treatment is required in order to obtain the desired well depth. Thus, after a certain depth of the well is obtained by the heat treatment at a relatively low temperature, when the heat treatment at a relatively high temperature is effected for a short time until the contraction of the OSF is started, the desired well depth can be obtained for shorter time without losing the OSF. The third embodiment shows such a method. In this method, it is important that a temperature difference between the temperature of the heat treatment at the maximum temperature in the semiconductor manufacturing process and the temperature of the pre-heat treatment does not become excessive.

The semiconductor elements were formed on the Si substrate by changing the treatment temperature at the former relatively low temperature and the treatment temperature at the latter maximum temperature in the method in which the well-drive which is the heat treatment at the maximum temperature among the semiconductor manufacturing processes for forming the semiconductor elements on the Si substrate is firstly effected at a relatively low temperature (temperature B° C.) and then at a high temperature (temperature A° C.). Regarding variations for temperature change, four cases in total, i.e., three cases where B is set to 900° C. and A is set to 1100° C., 1150° C. and 1200° C., respectively and one case where A is set to 1200° C. and B is set to 1100° C. were compared. In this case, in each case, the treatment time was adjusted to obtain the same well depth. An MCZ substrate of 6 inches in which Si crystal orientation of the surface of the substrate subjected to EG treatment is <100> was used as the Si substrate. Accordingly, at least before the heat treatment, the OSF having density greater than a certain value exists on the back surface of the Si substrate.

The ink supply port was opened in each Si substrate (on which the semiconductor elements were formed) by anisotropic etching. And, similar to the second embodiment, presence/absence of the OSF on the back surface of the substrate and the side etching speed were checked. A result is shown in the following Table 4, together with similar evaluation regarding a comparative example in which the ink supply port was opened in the Si substrate on which only the $SiO_2$ film was formed.

TABLE 4

| | Max. heat treatment temp. (° C.) | A–B (° C.) | Presence/ absence of OSF on back surface | Side etching speed (μm/hr) |
|---|---|---|---|---|
| Embodiments | 1100 | 200 | ○ | 11.7–12.2 |
| | 1150 | 250 | x | 3.6–6.0 |
| | 1200 | 300 | x | 3.8–7.7 |
| | 1200 | 100 | ○ | 11.2–11.8 |
| Comparative example | 1000 | 100 | ○ | 12.3–12.6 |

As apparent from the Table 4, in case of A–B>200, the OSF on the back surface of the substrate is lost, with the result that the side etching time is greatly deviated between 3 to 8 μm/hr due to the influence of the crystal defect. To the contrary, in case of A–B≦200, adequate OSF can be remained on the back surface of the substrate, and the side etching speed is stabilized at about 12 μm/hr. That is to say, by setting to A–B≦200, the OSF can be remained adequately on the back surface of the substrate, and adequate side etching speed can be reserved to absorb dispersion in etching speed due to presence/absence of the crystal defect, thereby stabilizing the side etching speed.

In the second embodiment, the OSF was lost when the well-drive was effected at the high temperature of 1200° C. However, in the third embodiment, even when the well-drive was effected at the high temperature of 1200° C., by effecting the well-drive at two stages (treatment at 1100° C. and treatment at 1200° C.), the OSF could be prevented from being lost and adequate OSF could be remained.

Then, when a plurality of articles in which the ink supply port was opened, by the anisotropic etching, in each of the Si substrates on which the semiconductor elements were formed under the above-mentioned various treatment conditions were manufactured, regarding each treatment condition, a rate that the open width of the ink supply port was deviated from a predetermined range was evaluated as poor etching rate. Results are shown in the following Table 5.

TABLE 5

| | Max. heat treatment temp. A (° C.) | A–B (° C.) | Poor etching Generating rate |
|---|---|---|---|
| Embodiments | 1100 | 200 | 1 |
| | 1150 | 250 | 22 |
| | 1200 | 300 | 25 |
| | 1200 | 100 | 2 |

As apparent from the results shown in the Table 5, it can be seen that, when the temperature difference (A–B) between the treatment temperature A of the heat treatment at the semiconductor manufacturing process and the temperature B of the pre-heat treatment is set to be equal to or smaller than 200° C., the rate for generating the poor etching is decreased greatly.

As mentioned above, according to the third embodiment, it was found that, by setting to A–B≦200, the open width of the ink supply port opened by the anisotropic etching can stably be made to the predetermined uniform width.

(Fourth Embodiment)

In the second and third embodiments, it was found that the OSF can be prevented from being lost by appropriately setting the temperature of the heat treatment at the high temperature (particularly, equal to or greater than 1100° C.) and particularly the temperature of the well-drive treatment. As a result of further investigations, the Inventors found that, even when the high temperature heat treatment is effected, by effecting the heat treatment under an atmosphere including oxygen, the OSF can be prevented from being lost. The fourth embodiment shows such a method.

First of all, formation of semiconductor elements on the Si substrate 1 carried out in the fourth embodiment will be explained. In the fourth embodiment, an Si substrate having a thickness of about 625 μm and oxygen density of 1.2 to $1.3\times10^{18}$ (atoms/$cm^2$) and in which Si crystal face orientation on the surface of the substrate is <100> was used. OSF density on the back surface of the Si substrate before the semiconductor elements are formed was $1\times10^5/cm^2$. Here, while an example that MOS structure elements are formed as the semiconductor elements was explained, the present invention can be applied to a case where for example BiCMOS structure elements are formed as other structure of the semiconductor elements.

First of all, the Si substrate is treated within gas including $O_2$ and $H_2$ for about 30 minutes under the temperature condition of 900° C. to form a oxidized film having a thickness of about 50 nm. This film is used as a damage dampening film during ion pouring in the later step. Then, resist having a predetermined thickness (about 1 μm) is formed by a photolithography technique, which resist is used as a mask during the ion pouring in the next step. Then, phosphorus ions are ion-poured to form an N well layer. Then, the resist is removed, and SiN films having a thickness of about 150 nm are formed on both surfaces of the substrate by a vacuum CVD method. Then, the SiN film formed on the back surface is removed by chemical dry etching. Then, N well-drive is carried out under the temperature condition of 1150° C.

Then, the SiN film on the front surface is patterned by the photolithography technique in order to obtain general LOCOS (local oxidation of silicon) structure, and further, after P+ and N+ channel layers are formed by using the photolithography and the ion pouring, LOCOS oxidation is effected to form an oxidized film. Then, after the surface density is adjusted again by ion pouring of boron, gate oxidation is effected under the temperature condition of 1000° C. to form a gate oxidized film having a thickness of about 70 nm. Thereafter, polysilicon having a thickness of about 400 nm is formed by a thermal decomposition method at about 600° C. using $SiH_4$ gas. And, the phosphorus is doped into the polysilicon by diffusion to form a gate poly film, which is made to a predetermined shape by the photolithography and reactive ion etching. Then, by repeating the photolithography and ion pouring, P+ and N+ source/drain layers are formed. Then, a BPSG (boron phosphorous silicate glass) film is formed by a CVD method, and, as the last step of the semiconductor manufacturing step, source/drain drive is carried out under the atmosphere of nitrogen at 1000° C. for 15 minutes.

After the semiconductor manufacturing step, further, for example, the following processing (treatments) is effected. First of all, in order to contact the semiconductor layer with a wiring Al which is formed in the later step, contact fall is formed by the photolithography and wet etching using BHF, and then, the wiring Al having a thickness of about 500 nm is formed by spattering and is patterned to have a predetermined pattern by the photolithography and reactive ion etching. Then, USG films as layer-to-layer films of Al multi-layer wiring are formed by the CVD method at about 400° C., and through-holes are formed in the USG films by the photolithography and reactive ion etching. Then, TaSiN resistance bodies having a thickness of about 40 nm as heaters (ink discharge energy generating elements) and aluminium having a thickness of about 200 nm as upper layer wiring are formed by the spattering and are patterned by the photolithography, dry etching and wet etching to form wiring portions and heater portions.

Then, an SiN film having a thickness of about 300 nm as a protective film for protecting the heater portions and the wiring portions is formed by the CVD method, and then, a Ta film having a thickness of about 230 nm as an anti-cavitation film for protecting the heater portions cavitation generated upon distinguishing bubbles is formed by the spattering. Lastly, the Ta film is patterned to a predetermined shape by the photolithography and dry etching, and the protective film on the electrode pad portions is removed to achieve electrical connection to the substrate.

In this way, the formation of the heaters (ink discharge energy generating elements) and the electrical circuit elements for driving the heaters is completed. Thereafter, as explained in connection with FIG. 1, the orifice plate material 4 is formed and the ink supply port 9 is opened in the Si substrate. When the ink supply port 9 is opened in the Si substrate, the $SiO_2$ film formed by the thermal oxidation in the aforementioned LOCOS oxidizing step is used as the etching mask.

As mentioned above, in the formation of the semiconductor elements on the Si substrate according to the illustrated embodiment, the heat treatment at the maximum temperature is the N well-drive treatment. In the illustrated embodiment, as mentioned above, the N well-drive treatment was carried out under the temperature condition of 1150° C. In this case, the OSF density on the back surface of the substrate and the dispersion in open width of the ink supply port after the anisotropic etching was effected were evaluated, regarding a case where the N well-drive treatment was effected in the gas atmosphere including only $N_2$ and a case where the N well-drive treatment was effected in the gas atmosphere including $N_2$ and $O_2$. In the case where $O_2$ is mixed to $N_2$, the evaluation was performed regarding a case where $N_2$:$O_2$ is 95:5 through the entire treatment time (about 540 minutes) and a case where $N_2$:$O_2$ is 1:1 for initial 20 minutes and $N_2$:$O_2$ is 95:5 for remaining 520 minutes. Results are shown in the following Table 6.

TABLE 6

| N well-drive condition (temperature 1150° C.) | OSF density on back surface of substrate (× $10^4/cm^2$) | Dispersion in open width (MAX-MIN) (μm) |
|---|---|---|
| A | 0 | 60 |
| B | 3.1 | 40 |
| C | 3.9 | 30 |

Where, A: 540 minutes under $N_2$ atmosphere, B: 540 minutes under atmosphere in which $N_2$:$O_2$=95:5, and C: 20 minutes under atmosphere in which $N_2$:$O_2$=1:1+520 minutes under atmosphere in which $N_2$:$O_2$=95:5.

As apparent from the results shown in the Table 6, in the N well-drive treatment for effecting the treatment at high temperature, by effecting the treatment under the atmosphere including oxygen, the OSF could be prevented from being lost, with the result that the dispersion in open width of the ink supply port could be suppressed.

The reason that the OSF can be prevented from being lost by effecting the N well-drive treatment under the gas atmosphere including oxygen is considered as follows. When the N well-drive treatment is effected under the gas atmosphere including oxygen, the $SiO_2$ film is formed on the back surface of the substrate. When the treatment is effected for 540 minutes under the gas atmosphere in which $N_2$:$O_2$ is 95:5, the thickness of the formed $SiO_2$ film is about 300 nm. During the formation of the $SiO_2$ film, in the interface between Si and $SiO_2$ on the back surface of the substrate, the OSF is formed by distortion caused by volume expansion of $SiO_2$. In this way, since the OSF is formed to compensate for loss of the original OSF due to the high temperature, it is considered that a certain amount ($2\times10^4$ parts/$cm^2$ or greater in the above example) of OSF can be remained eventually.

As mentioned above, according to the illustrated embodiment, it was found that, when the Si substrate is subjected to the high temperature treatment, by effecting such treatment under the gas atmosphere including oxygen, the OSF on the back surface of the Si substrate can be prevented from being lost and a certain amount of OSF can be remained. Thus, the open width of the ink supply port opened by the anisotropic etching can stably be made to the predetermined uniform width.

Incidentally, in the above-mentioned embodiments, while an example that the well-drive is effected as the high temperature treatment of the Si substrate was explained, the high temperature treatment is not limited to the well-drive, but, the present invention can be applied to various high temperature treatments. Further, the methods for manufacturing the ink discharge energy generating elements and the drive circuit therefor shown in the embodiments do not limit the present invention.

Further, in the embodiments, the use of the Si substrate in which the oxygen density is equal to or smaller than $1.3\times10^{18}$, particularly the MCZ substrate is preferable to achieve the objects of the present invention. That is to say, by using the Si substrate having low oxygen density, as mentioned above, occurrence of the etching abnormality can be suppressed and the etching speed can be stabilized, and, in the ink jet recording head manufacturing method according to the present invention, by using such an Si substrate, the dispersion in open width of the ink supply port can also be suppressed.

As mentioned above, according to the present invention, in the ink jet recording head manufacturing method having a step for forming or opening the ink supply port by the anisotropic etching of Si, when the anisotropic etching is effected, by properly controlling the OSF on the back surface of the substrate, the occurrence of the etching abnormality can be suppressed and the open width of the ink supply port at the front surface of the substrate can stably be made to the predetermined uniform width.

As a result, through-put of the manufacture of the ink jet recording head can be enhanced, and reliability of discharging performance of the ink jet recording head can be enhanced. Further, the distance between the ink supply port and the ink discharge energy generating elements can be set to be shorter, with the result that an ink jet recording head having high discharging frequency can be manufactured with high through-put.

What is claimed is:

1. A method for manufacturing a liquid discharge head, comprising:

- a step for preparing an Si substrate having a first surface as an element forming surface and a second surface as a back surface opposite to the first surface;
- a step for effecting heat treatment by heating of said Si substrate;
- a step for forming an $SiO_2$ film on the second surface of said Si substrate;
- a step for forming an etching start opening portion in said $SiO_2$ film to expose said Si substrate;
- a step for forming a liquid discharge energy generating element for generating energy for discharging liquid on the first surface of said Si substrate; and
- a step for forming a liquid supply port passing through said Si substrate and communicated with the first surface from said etching start opening portion by anisotropic etching of Si using said $SiO_2$ film as a mask, after said heat treatment step,
- wherein, before the anisotropic etching is effected, the density of oxidation induced laminate defects existing in an interface between said Si substrate and said $SiO_2$ film is made to be equal to or greater than $2\times10^4$ parts/$cm^2$.

2. A method according to claim 1, further comprising a step for forming a member constituting a liquid discharge port for discharging the liquid and a liquid flow path communicated with said liquid discharge port, on the surface of said Si substrate on which said liquid discharge energy generating element is formed.

3. A method according to claim 1, wherein, before the anisotropic etching is effected, a length of the oxidation induced laminate defects existing in said interface between said Si substrate and said $SiO_2$ film is made to be equal to or greater than 2 $\mu$m.

4. A method according to claim 1, wherein said $SiO_2$ film is formed by thermal oxidation during the heat treatment.

5. A method according to claim 1, wherein the heat treatment is effected at a treatment temperature equal to or less than 1100° C.

6. A method according to claim 1, wherein, before the heat treatment at a treatment temperature of A° C. is effected, treatment similar to the heat treatment is effected at a lower temperature of B° C. satisfying $A-B\leqq200$° C.

7. A method according to claim 1, wherein treatment having a treatment temperature equal to or greater than 1100° C., among the heat treatment, is effected under a gas atmosphere including oxygen.

8. A method according to claim 1, wherein said liquid discharge head includes a semiconductor element on said Si substrate, and the heat treatment is effected in a step for forming said semiconductor element.

9. A method according to claim 8, wherein said semiconductor forming step is a step of well-driving.

10. A method according to claim 1, wherein said Si substrate has a gettering site formed by effecting mechanical damage on the second surface of said Si substrate before said anisotropic etching step.

11. A method according to claim 1, wherein a substrate in which the oxygen density is equal to or less than $1.3\times10^{18}$ (atoms/$cm^3$) is used as said Si substrate.

12. A method according to claim 1, wherein an MCZ substrate is used as said Si substrate.

13. A method according to claim 1, wherein a substrate in which the Si crystal face orientation of the surface on which said liquid discharge energy generating element is formed is <100> or <110> is used as said Si substrate.

14. A substrate working method comprising:

- a step for effecting heat treatment by heating of an Si substrate;
- a step for forming an $SiO_2$ film on at least one surface of said Si substrate;
- a step for forming an etching start opening portion in said $SiO_2$ film to expose said Si substrate; and
- a step for forming a through-hole passing through said Si substrate from said etching start opening portion by anisotropic etching of Si using said $SiO_2$ film as a mask, after said heat treatment step,
- wherein, before the anisotropic etching is effected, the density of oxidation induced laminate defects existing in an interface between said Si substrate and said $SiO_2$ film is made to be equal to or greater than $2\times10^4$ parts/$cm^2$.

15. A substrate working method according to claim 14, wherein, before the anisotropic etching is effected, a length of the oxidation induced laminate defects existing in said interface between said Si substrate and said $SiO_2$ film is made to be equal to or greater than 2 $\mu$m.

16. A substrate working method according to claim 14, wherein said $SiO_2$ film is formed by thermal oxidation during the heat treatment.

17. A substrate working method according to claim 14, wherein the heat treatment is effected at a treatment temperature equal to or less than 1100° C.

18. A substrate working method according to claim 14, wherein, before the heat treatment at a treatment temperature of A° C. is effected, treatment similar to the heat treatment is effected at a lower temperature of B° C. satisfying A–B≦200° C.

19. A substrate working method according to claim 14, wherein treatment having a treatment temperature equal to or greater than 1100° C., among the heat treatment, is effected under a gas atmosphere including oxygen.

20. A substrate working method according to claim 14, wherein the heat treatment is well-driving.

21. A substrate working method according to claim 14, wherein a substrate in which the oxygen density is equal to or less than $1.3\times10^{18}$ (atoms/$cm^3$) is used as said Si substrate.

22. A substrate working method according to claim 14, wherein an MCZ substrate is used as said Si substrate.

* * * * *

UNITED STATES PATENT AND TRADEMARK OFFICE

CERTIFICATE OF CORRECTION

PATENT NO. : 6,858,152 B2
DATED : February 22, 2005
INVENTOR(S) : Shuji Koyama et al.

It is certified that error appears in the above-identified patent and that said Letters Patent is hereby corrected as shown below:

Column 3,
Line 8, "which a" should read -- which an --.
Line 27, "to promote to form" should read -- to promote forming --.

Column 4,
Line 3, "can" should read -- can be --.
Line 6, "preferable that" should read -- preferable to have --.

Column 5,
Line 43, "clarify's" should read -- clarity's --.
Line 58, "element" should read -- elements --.

Column 6,
Line 67, "remained" should read -- retained --.

Column 7,
Line 1, "is it" should read -- it is --.
Line 60, "with using" should read -- by using --.
Line 65, "with using" should read -- by using --.

Column 8,
Line 3, "with using" should read -- by using --.
Line 8, "contact" should read -- come in contact --.
Line 22, "(ten and several (hours)." should read -- (several hours) --.

Column 9,
Line 51, "deviated" should read -- further greatly deviated --.
Line 58, "further greatly" should be deleted.

Column 10,
Line 20, "well-drive" should read -- good drive --.

Column 11,
Line 66, "small" should read -- smallest --.

UNITED STATES PATENT AND TRADEMARK OFFICE

CERTIFICATE OF CORRECTION

PATENT NO. : 6,858,152 B2

DATED : February 22, 2005

INVENTOR(S) : Shuji Koyama et al.

It is certified that error appears in the above-identified patent and that said Letters Patent is hereby corrected as shown below:

<u>Column 12,</u>
Line 2, “small” should read -- smallest --.
Line 28, “methods” should read -- the methods --.
Line 31, “gettering” should read -- a gettering --.
Line 32, “contaminant” should read -- contaminants --.
Line 30, “The gettering” should read -- Gettering --.
Line 39, “The mechanical” should read -- Mechanical--; and “factors” should read -- the factors --.
Line 41, “than some extent is existing” should read -- to some extent exists --.
Line 50, “hole” should read -- through-hole--; and “greatly” should read -- closely --.

<u>Column 13,</u>
Line 59, “since the” should read -- since --.

<u>Column 14,</u>
Line 21, “exist” should read -- exists --.

<u>Column 17,</u>
Line 18, “a oxidized” should read -- an oxidized --.

Signed and Sealed this

Seventh Day of February, 2006

JON W. DUDAS

*Director of the United States Patent and Trademark Office*